(12) United States Patent
Matsuyama et al.

(10) Patent No.: US 6,467,976 B2
(45) Date of Patent: Oct. 22, 2002

(54) COATING AND DEVELOPING SYSTEM

(75) Inventors: Yuji Matsuyama, Kumamoto (JP); Junichi Kitano, Yamanashi (JP); Takahiro Kitano, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/849,260

(22) Filed: May 7, 2001

(65) Prior Publication Data

US 2002/0127879 A1 Sep. 12, 2002

(30) Foreign Application Priority Data

May 10, 2000 (JP) .......................................... 2000-137499

(51) Int. Cl.$^7$ .............................. G03D 5/00; B05C 11/08
(52) U.S. Cl. .......................... 396/611; 118/52; 118/666
(58) Field of Search ............................. 396/611; 118/52, 118/58, 66, 666, 667; 414/935, 938, 939, 941

(56) References Cited

U.S. PATENT DOCUMENTS 6,319,322 B1 * 11/2001 Ueda et al. ................. 118/319
6,341,903 B1 *  1/2002 Ueda .......................... 396/611
6,379,056 B1 *  4/2002 Ueda .......................... 396/611

FOREIGN PATENT DOCUMENTS

JP          2000-188253         4/2000

* cited by examiner

Primary Examiner—Alan A. Mathews
(74) Attorney, Agent, or Firm—Oblon, Spivak, McClelland, Maier & Neustadt, P.C.

(57) ABSTRACT

The present invention has a processing zone having a coating unit for forming a coating film on a substrate, a developing unit for performing development of the substrate, a heat treatment unit for performing heat treatment of the substrate, and a first transfer device for transferring the substrate from/to the coating unit, the developing unit and the heat treatment unit, an interface section in which the substrate is transferred at least on a path between the processing zone and an exposure processing unit outside the system for performing exposure processing for the substrate, a casing for housing the processing zone and the interface section, a gas supply device for supplying an inert gas into the interface section, and an exhaust portion through which an atmosphere in the interface section is discharged, and the heat treatment unit, and a second transfer device for transferring the substrate on a path between the heat treatment unit and the exposure processing unit are disposed in the interface section.

According to the present invention, impurities at a molecular level, such as oxygen, basic substances, ozone, and organic substances, can be prevented from adhering to a substrate, and thus treatment and processing for the substrate are suitably performed.

10 Claims, 7 Drawing Sheets

COATING AND DEVELOPING SYSTEM

BACKGROUND OF THE INVENTION

1. Field of the Invention

The present invention relates to a coating and developing system for a substrate.

2. Description of the Related Art

In a photolithography process in semiconductor device fabrication processes, for example, resist coating treatment in which a resist film is formed on a top surface of a wafer, developing treatment in which development is performed for the wafer after being exposed in a pattern, and heating treatment and cooling treatment, which are performed before the coating treatment, before and after exposure processing, and after the developing treatment, and the like are performed. The above treatments are performed in each treatment unit individually provided, and these treatment units are integrated as a coating and developing system so that the aforementioned series of treatments can be performed in succession. Exposure processing for the pattern, itself, is usually performed in the exposure processing unit provided adjacently to the coating and developing system.

The aforementioned coating and developing system is composed of a load/unload section for carrying a substrate into and out of the coating and developing system, a processing zone having a coating unit, a developing unit, heating treatment unit and the like, in Which most of the aforementioned wafer; treatments are performed, and an interface section for transferring a wafer from/to the processing zone and the exposure processing unit outside the aforementioned system.

When the treatments for a wafer are performed in the coating and developing system, air cleaned by an air cleaner or the like is supplied into the aforementioned coating and developing system as a down flow in order to prevent impurities such as very small particles from adhering to the wafer, while an atmosphere inside the coating and developing system is exhausted so that the treatments can be performed for the wafer in a clean state.

Further, after a predetermined circuit pattern is exposed on a resist film formed on the wafer, the wafer is transferred to the heat treatment unit, whereby PEB (Post Exposure Baking) that is heating after exposure is performed, thus intending to improve the formation of a pattern.

However, an art of exposure with use of a light with a shorter wavelength (for example, 157 nm) is recently being developed in order to form a finer and more precise circuit pattern. When using the light with a short wavelength, there is a fear that impurities at a molecular level such as, for example, oxygen, ozone, water-vapor, which did not become a problem so far, have an adverse effect on exposure processing and a precise circuit pattern is not formed.

Consequently, at least when a wafer is subjected to exposure processing, it is necessary to prevent impurities such as oxygen from adhering onto the wafer, but since impurities such as oxygen are contained in the air, only supplying clean air as conventionally cannot effectively prevent the impurities from adhering onto the wafer, or cannot remove the impurities, which have already adhered to the wafer.

If the aforementioned impurities adhere to the wafer while the wafer is carried from the exposure processing unit and carried into the heat treatment unit, an adverse effect is exerted on the formation of the circuit pattern. Further, when a chemically amplifying resist film is used, if much time is taken to transfer the wafer to the PEB after the exposure processing, there arises a fear that amplification reaction of acid proceeds during that time, which causes a variation in a line width of the circuit pattern. Further, since a plurality of wafers are treated in the coating and developing system, if the transferring time of each wafer to the PEB after the exposure processing differs, namely, if PED (Post Exposure Delay) differs, a variation occurs to the line width of each wafer.

Pattern deformation to an extent that is conventionally negligible has a room for improvement at the present day when a more precise circuit pattern is demanded, and the conventional configuration with clean air and the coating and developing system cannot meet the demand.

SUMMARY OF THE INVENTION

The present invention is made in view of the above points, and its object is to provide a coating and developing system in which very small impurities at a molecular level do not adhere to a substrate such as a wafer, and a more precise circuit pattern can be obtained.

In order to attain the above object a coating and developing system of the present invention has a processing zone having a coating unit for forming a coating film on a substrate, a developing unit for performing development of the substrate, a heat treatment unit for performing heat treatment of the substrate, and a first transfer device for transferring the substrate from/to the coating unit, the developing unit and the heat treatment unit, an interface section in which the substrate is transferred at least on a path between the aforementioned processing zone and an exposure processing unit outside the system for performing exposure processing for the substrate, a casing for housing the aforementioned processing zone and interface section, a gas supply device for supplying an inert gas into the aforementioned interface section, and an exhaust portion through which an atmosphere of the aforementioned interface section is discharged, and the heat treatment unit, and a second transfer device for transferring the substrate on a path between the heat treatment unit and the exposure processing unit are disposed in the aforementioned interface section.

In the present invention, the heat treatment unit disposed in the interface section is capable of performing heat treatment immediately before exposure processing, and is also capable of performing heat treatment immediately after the exposure processing.

According to the present invention, while the inert gas is supplied to the interface section from the gas supply device, the atmosphere of the interface section is discharged from the exhaust portion, thereby making it possible to remove impurities such as oxygen and water vapor from the interface section and maintain the interface section in a clean state. Consequently, while the substrate goes from heat treatment immediately before exposure processing through the exposure processing to heat treatment immediately after the exposure processing, the substrate can be transferred in a clean atmosphere of the inert gas, and impurities can be prevented from adhering thereto. After the substrate with a coating film being formed is heat-treated, it is especially in a state in which impurities easily adhere onto the substrate. If an impurity adheres to the substrate on exposure processing, the impurity absorbs energy such as a laser light used for exposure, which causes a fear that the exposure processing is not suitably performed. However, by disposing the heat treatment unit in the interface section and maintaining the path on which the substrate passes immediately before the exposure processing in the state of the clean atmosphere of the inert gas as in the present invention, the treatment and processing of the substrate can be suitably performed.

The aforementioned inert gas means an inert gas to the treatment solutions, for example, a coating solution and a developing solution, used in the coating and developing system, and the inert gas is, for example, nitrogen gas, argon, neon and the like, which does not contain oxygen, water, and organic substances.

DETAILED DESCRIPTION OF THE PREFERRED EMBODIMENT

Figure 1:
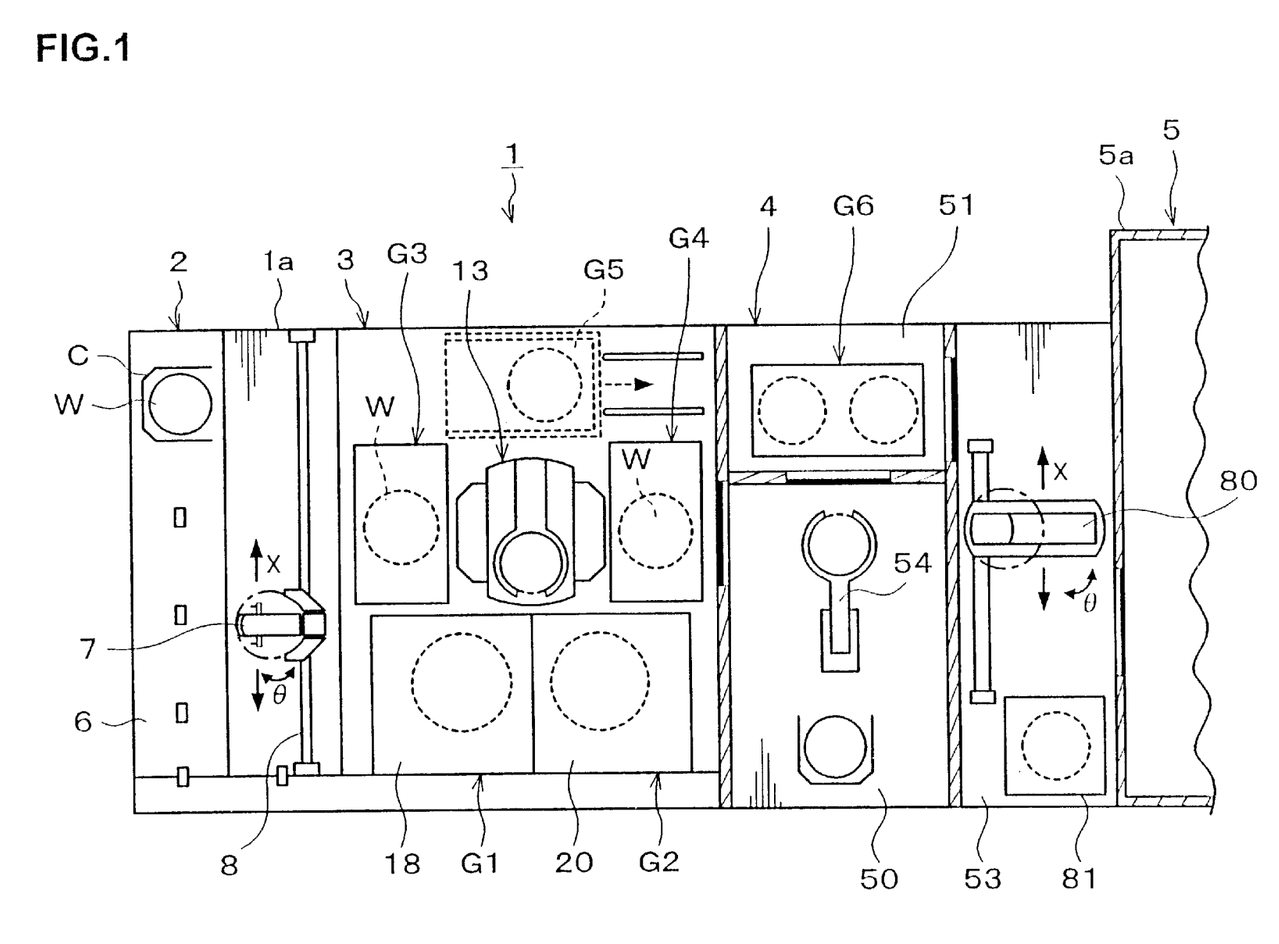
FIG. 1 is an explanatory view seen from a plane of a coating and developing system according to a present embodiment.
Figure 2:
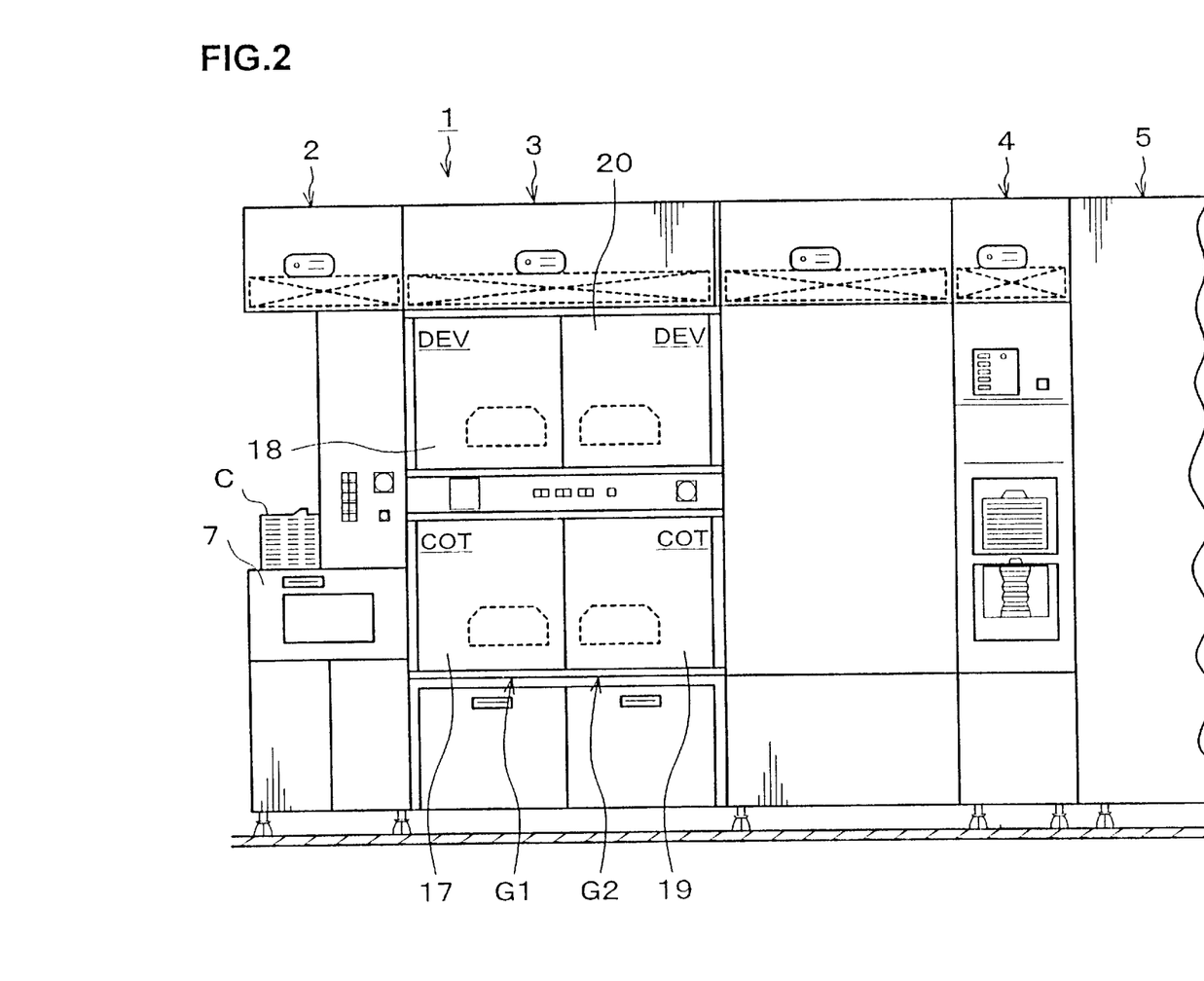
FIG. 2 is a front view of the coating and developing system in FIG. 1
Figure 3:
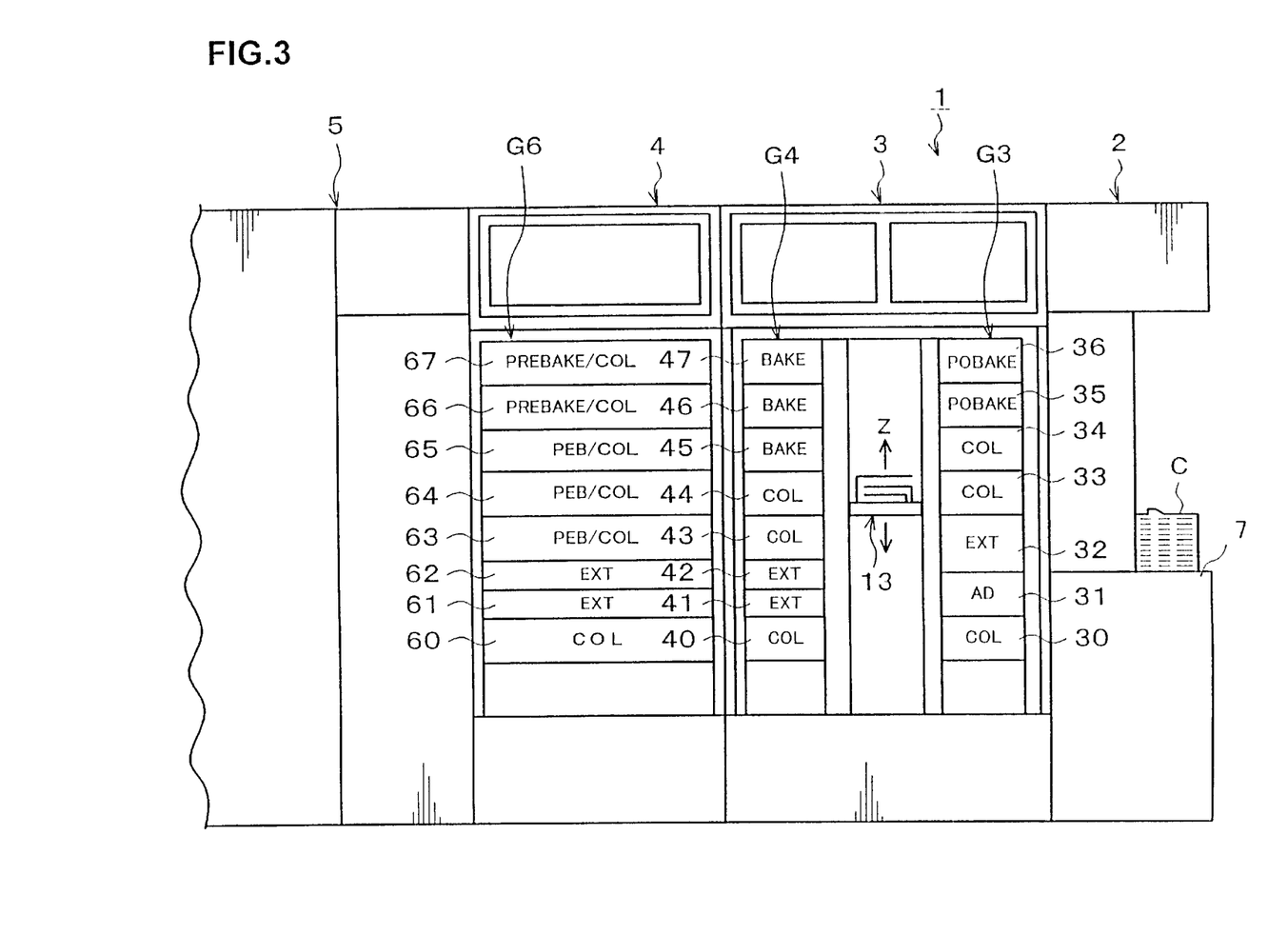
FIG. 3 is a rear view of the coating and developing system in FIG. 1.

A preferred embodiment of the present invention will be explained hereinafter. FIG. 1 is a plane view of a coating and developing system 1 according to the present embodiment, FIG. 2 is a front view of the coating and developing system 1, and FIG. 3 is a rear view of the coating and developing system 1.

As shown in FIG. 1, the coating and developing system 1 has a structure in which a cassette station 2 for carrying, for example, 25 wafers W from/to the outside to/from the coating and developing system 1 in the unit of cassette and for carrying the wafers W into/from a cassette C, a processing station 3 as a processing zone in which various kinds of multi-tiered processing and treatment units for performing predetermined processing and treatment for the wafers one by one in the coating and developing process are disposed, and an interface section 4 for receiving and delivering the wafer W from/to an exposure processing unit 5 provided adjacently to the coating and developing system 1, are integrally connected in a casing 1a.

In the cassette station 2, a plurality of cassettes C are mountable at predetermined positions on a cassette mounting table 6 serving as a mounting section in a line in an X-direction (the perpendicular direction in FIG. 1). Further, a wafer carrier 7, which is transferable in the direction of alignment of the cassettes (the X-direction) and in the direction of alignment of the wafers W housed in the cassette C (a Z-direction; a perpendicular direction), is provided to be movable along a carrier path 8 and is selectively accessible to the respective cassettes C.

The wafer carrier 7 has an alignment function for aligning the wafer W. The wafer carrier 7 is structured so as to be also accessible to an extension unit 32 and an adhesion unit 31 included in a third processing unit group G3 on the side of the processing station 3 as will be described later.

In the processing station 3, a main transfer device 13 as a first transfer device is provided in a center part thereof, and various kinds of processing units are multi-tiered on the periphery of the main transfer device 13 to compose processing unit groups. In the coating and developing system 1, there disposed are four processing unit groups G1, G2, G3 and G4, and the first and the second processing unit groups G1 and G2 are disposed on the front side of the coating and developing system 1, the third processing unit group G3 is disposed adjacently to the cassette station 2, and the fourth processing unit group G4 is disposed adjacently to the interface section 4. Further, as an option, a fifth processing unit group G5 depicted by the broken line can be additionally arranged on the rear side thereof. The aforementioned main carrier unit 13 can carry the wafer W into/from various kinds of processing units described later disposed in these processing unit groups G1, G2, G3, G4 and G5.

In the first processing unit group G1, a resist coating unit 17 for applying a resist solution to the wafer W and a developing unit 18 for performing developing treatment for the wafer W after exposure processing are two-tiered in the order from the bottom, for example, as shown in FIG. 2. As for the second processing unit group G2, a resist coating unit 19 and a developing unit 20 are similarly two-tiered in the order from the bottom.

In the third processing unit group G3, a cooling unit 30 for cooling the wafer W, an adhesion unit 31 for increasing the adhesion between a resist solution and the wafer W, the extension unit 32 for keeping the wafer W waiting, cooling units 33 and 34 for cooling the wafer W after developing treatment, postbaking units 35 and 36 for performing heating treatment for the wafer W after developing treatment, and so on are, for example, seven-tiered in the order from the bottom.

In the fourth processing unit group G4, a cooling unit 40 for cooling the wafer W, extension units 41 and 42, and cooling units 43 and 44, and heat treatment units (BAKE) 45, 46 and 47 for performing heat treatment for the wafer W after an antireflection film is formed when the antireflection film for suppressing a stationary wave during exposure processing is formed, and so on are, for example, eight-tiered in the order from the bottom.

Figure 4:
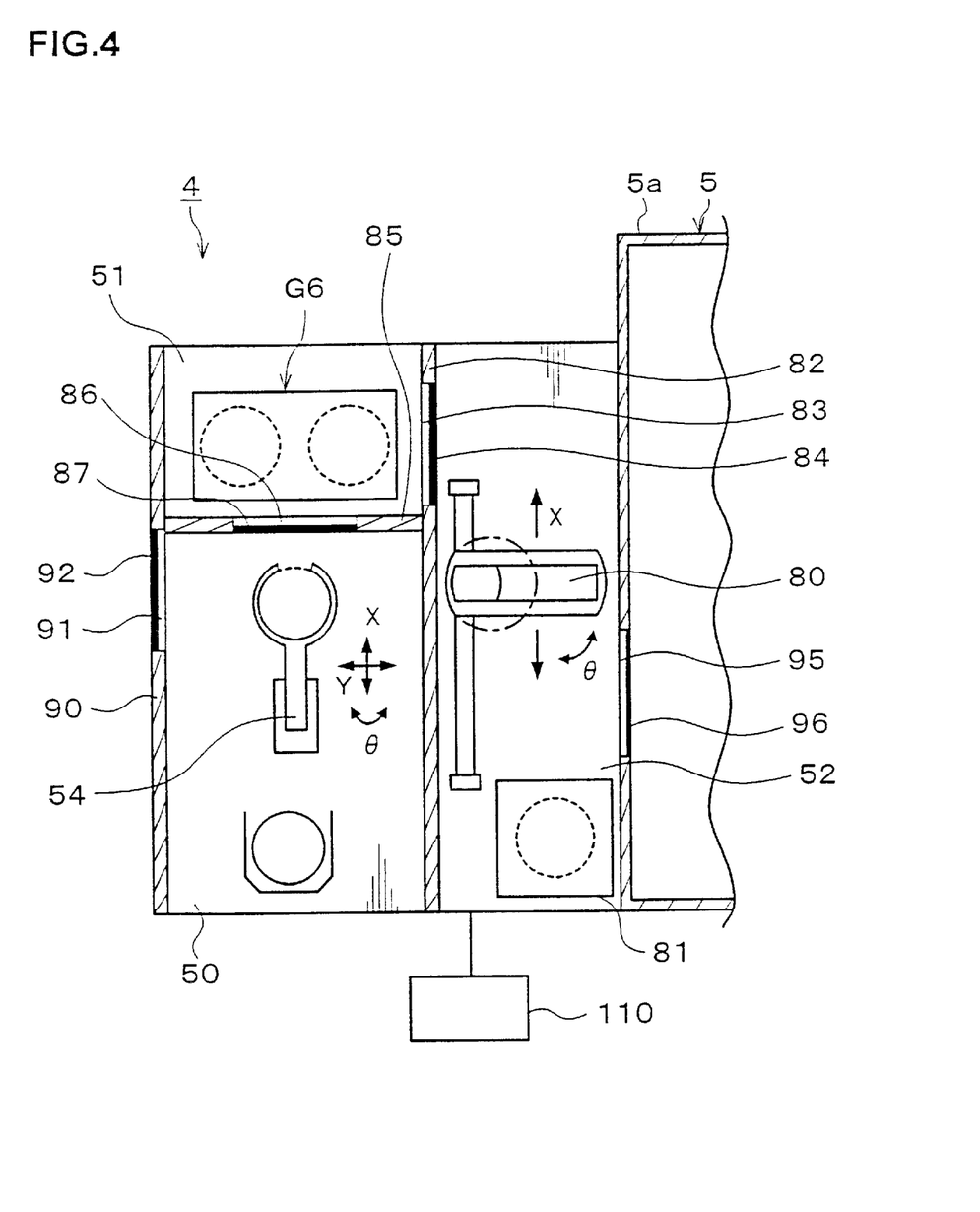
FIG. 4 is a plane view showing an enlarged appearance of an inside of an interface section.

As shown in FIG. 4, the interface section 4 is divided into a transfer area 50, a heat treatment area 51 and a delivery area 52. In the transfer area 50, a wafer transfer mechanism 54 as a third transfer device is disposed. The wafer transfer mechanism 54 is structured so as to be movable in the directions X and Y (the up-and-down direction and the left and right direction in FIG. 1) and the direction Z (the perpendicular direction), and to be rotatable in a direction θ (a rotational direction about an axis Z), so that it can transfer the wafer w to various kinds of processing units included in a sixth processing unit group G6 which will be described later.

In the heat treatment area 51, the aforementioned sixth processing unit group G6 is disposed. In the sixth processing unit group G6, as shown in FIG. 3, for example, a cooling unit 60, extension units 61 and 62, heat and cooling treatment units 63, 64 and 65 (PEB/COL in FIG. 3) for heating the wafer W after exposure processing (Post Exposure Baking) and thereafter cooling it to a predetermined temperature, heat and cooling treatment units 66 and 67 (PREBAKE/COL in FIG. 3) for heating the wafer W before exposure processing to evaporate a solvent in the resist solution and thereafter cooling it to a predetermined temperature, and the like are, for example, eight-tiered in the order from the bottom.

Figure 5:
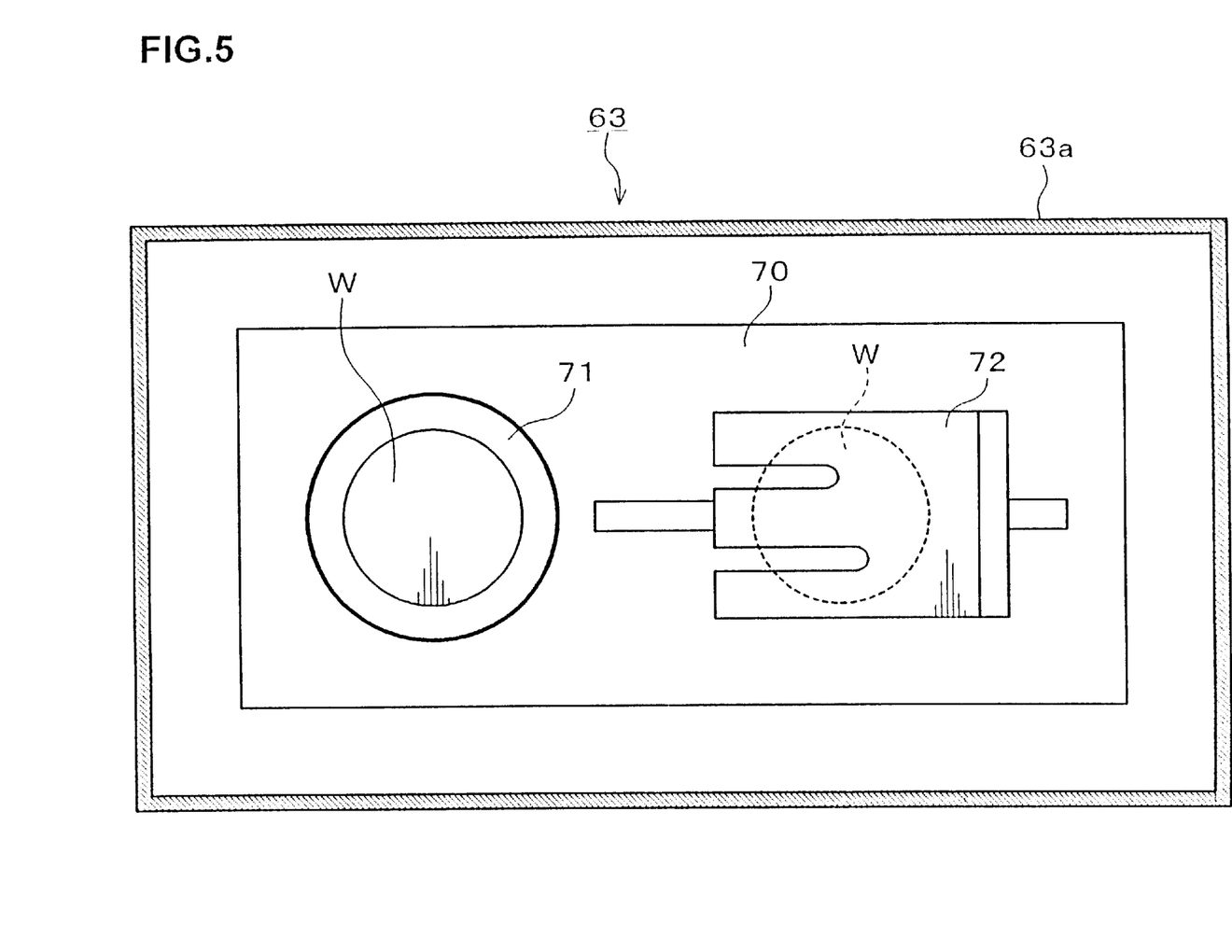
FIG. 5 is a horizontal sectional view showing an outline of a heating and cooling treatment unit in the coating and developing system in FIG. 1.

The aforementioned heat and cooling treatment unit 63 has a disc-shaped heating plate 71 for heating the wafer W, on a base 70 inside a casing 63a, and a cooling plate 72 moving above the heating plate 71, for receiving the wafer W from the heating plate 71 and cooling it. Consequently, in the heat and cooling treatment unit 63, heat and cooling treatment for the wafer W is successively performed in the same unit, so that a heat history given to the wafer W by heating can be always kept constant. The other heat and cooling treatment units 64 to 67 also have the same configuration as the heat and cooling treatment unit 63.

In the delivery area 52, a wafer carrier 80 as a second transfer device is disposed. The wafer carrier 80 is structured to be movable in the direction X (the up and down direction in FIG. 1) and in the direction Z (the perpendicular direction), and rotatable in the direction θ (the rotation direction around the axis Z), and to be able to transfer the wafer W to a peripheral aligner 81 included in the aforementioned processing unit group G6, and the exposure processing unit 5 outside the system.

A first partition plate 82 is provided between the transfer area 50 and the heat treatment area 51, and the delivery area 52. The first partition plate 82 shuts off the atmosphere of the transfer area 50 and the heat treatment area 51 from that of the delivery area 52. The first partition plate 82 is provided with a first passage port 83, whereby the aforementioned wafer carrier 80 can access the various kinds of processing units included in the aforementioned sixth processing unit group G6 and transfer the wafer W from/to the heat treatment area 51 to/from the delivery area 52. Further, the first passage port 83 is provided with a first shutter 84 free to be opened and closed, so that the first shutter 84 is opened only when the wafer W passes through the first passage port 83, and during the other time, the first shutter 84 is closed.

A second partition plate 85 is provided between the transfer area 50 and the heat treatment area 51. The second partition plate 85 shuts off the atmosphere of the transfer area 50 from that of the heat treatment area 51. The second partition plate 85 is provided with a second passage port 86, whereby the aforementioned wafer transfer mechanism 54 can access the various kinds of units included in the aforementioned sixth processing unit group G6t and transfer the wafer W from/to the transfer area 50 to/from the heat treatment area 51. Further, the second passage port 86 is provided with a second shutter 87, so that the second shutter 87 is opened only when the wafer W passes through the second passage port 86 and the second shutter 87 is closed during the other time.

A third partition plate 90 is provided between the processing station 3 and the interface section 4. The third partition plate 90 shuts off the atmosphere of the processing station 3 from that of the interface section 4. The third partition plate 90 is provided with a third passage port 91 at a position opposing the extension units 41 and 42 included in the aforementioned fourth processing unit group G4, whereby the aforementioned wafer transfer mechanism 54 can access the extension units 41 and 42 and transfer the wafer W from/to the processing station 3 to/from the interface section 4.

The third passage port 91 is provided with a third shutter 92 for opening and closing the third passage port 91, so that the third shutter 92 is opened only when the wafer W passes through the third passage port 91 and the third shutter 92 is closed during the other time.

The exposure processing unit 5 for performing exposure processing for the wafer W is provided adjacently to the interface section 4. The exposure processing unit 5 is hermetically sealed by a casing 5a of the exposure processing unit 5, so that the atmosphere inside the exposure processing unit 5 can be strictly controlled. A passage port 95 through which the wafer W is transferred from/to the interface section 4 is provided at the interface section 4 side of the casing 5a, and the passage port 95 is provided with a shutter 96 for opening and closing the passage port 95.

Figure 6:
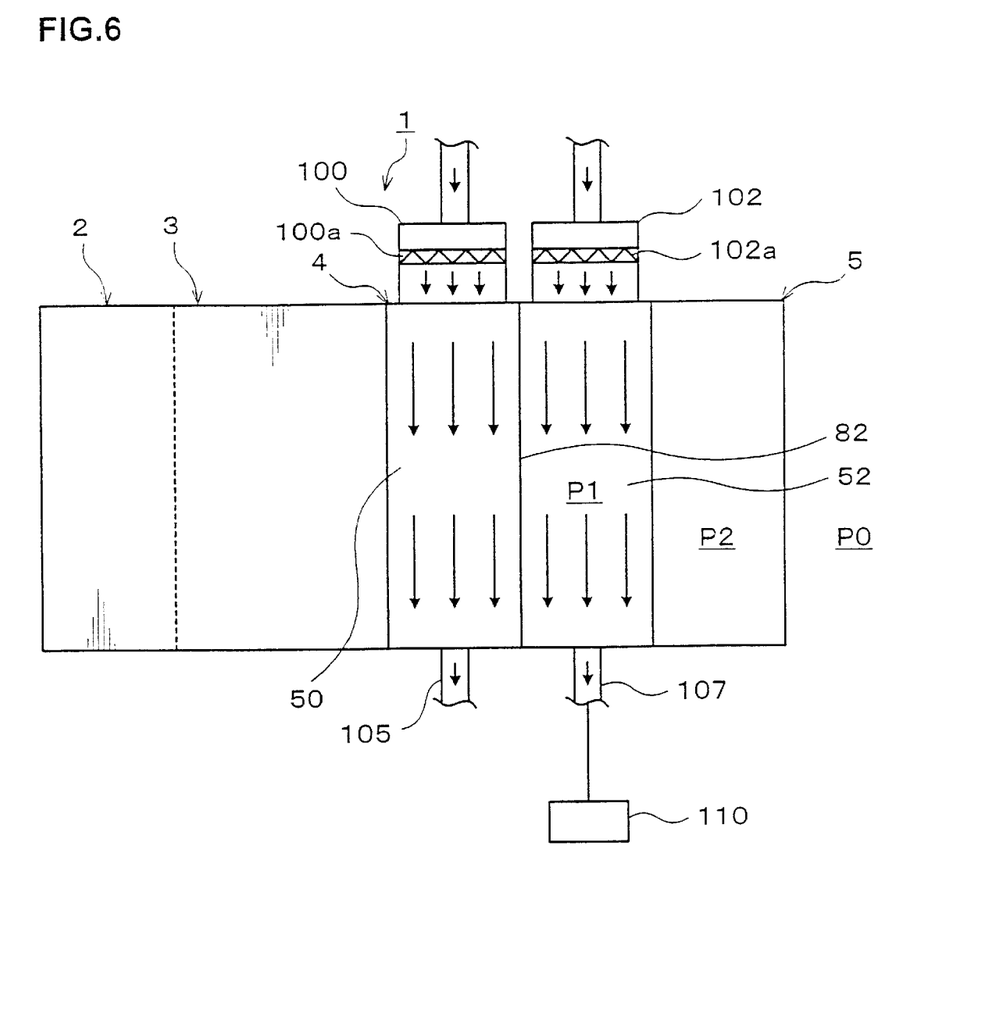
FIG. 6 is an explanatory view in a case in which a flow state of an inert gas supplied to the interface section is seen in a side direction of the coating and developing system.
Figure 7:
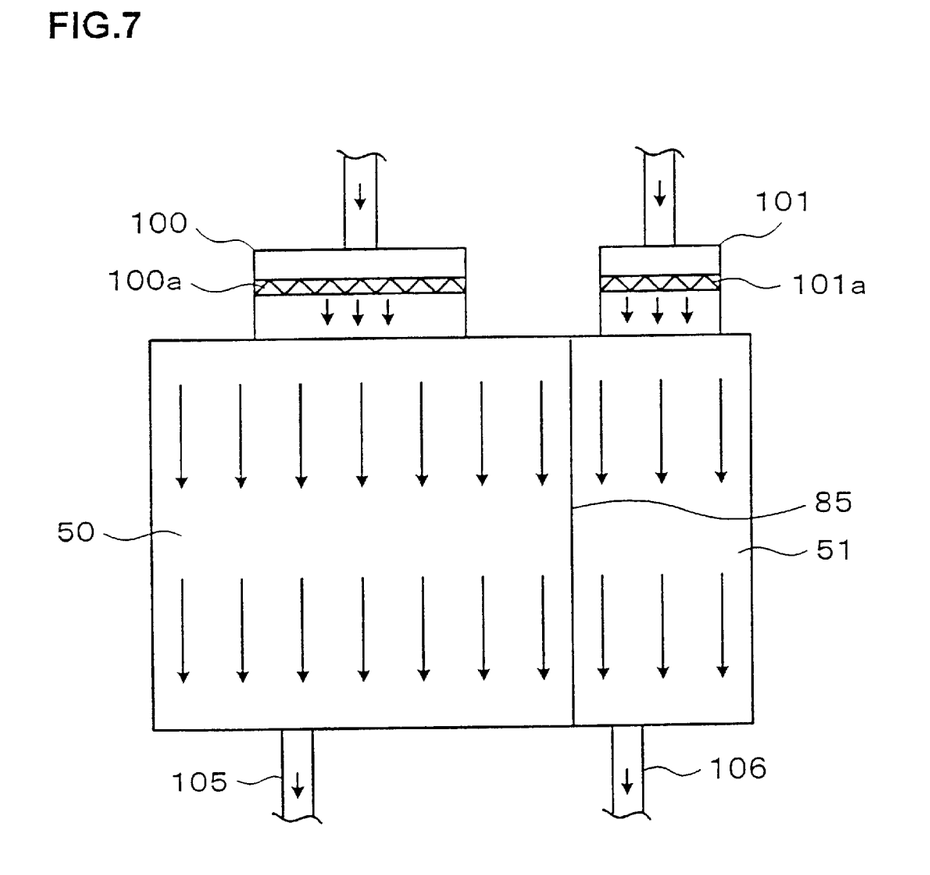
FIG. 7 is an explanatory view of a vertical section showing a flow state of the inert gas supplied to a transfer area and a heat treatment area of the interface section.

A gas supply device for supplying an inert gas is individually provided at an upper portion of each area of the interface section 4 structured as above. Specifically, as shown in FIG. 6 and FIG. 7, a third gas supply device 100 is provided at the upper portion of the transfer area 50, a first gas supply device 101 at the upper portion of the heat treatment area 51 and a second gas supply device 102 at the upper portion of the delivery area 52, respectively. An inert gas, for example, nitrogen gas ($N_2$) can be supplied from the third gas supply device 100 into the transfer area 50, from the first gas supply device 101 into the heat treatment area 51, and from the second gas supply device 102 into the delivery area 52.

These gas supply devices 100 to 102 are each provided with a function of controlling the inert gas supplied from a supply source or the like not shown at a predetermined temperature and humidity, and are provided with ULPA filters 100a, 101a, and 102a for removing a very small particles in the inert gas, respectively, so that the cleaned inert gas with its temperature and humidity being controlled for each area can be supplied to the transfer area 50, the heat treatment area 51, and the delivery area 52.

A third exhaust pipe 105 as a third exhaust portion is provided at a lower portion of the transfer area 50, a first exhaust pipe 106 as a first exhaust portion at a lower portion of the heat treatment area 51, and a second exhaust pipe 107 as a second exhaust portion at a lower portion of the transfer area 52, respectively, so that the atmosphere in each area is discharged. Accordingly, the inert gas supplied into each of the aforementioned areas from each of the aforementioned gas supply devices 100 to 102 is designed to be discharged from each of the exhaust pipes 105 to 107 through each area, so that impurities in each area, for example, oxygen, ozone, water vapor and the like are purged and the atmosphere inside each area can be maintained clean.

Pressure inside the transfer area 50 can be controlled by controlling the supply amount of the inert gas of the third gas supply device 100, and pressure inside the heat treatment area 51 can be controlled by controlling the supply amount of the inert gas of the gas supply device 101. The second exhaust pipe 107 leads to a pressure reducing device 110 composed of, for example, a turbo-molecular pump and the like. The pressure reducing device 110 draws a vacuum inside the transfer area 52 to reduce the pressure to a predetermined pressure.

Next, the photolithography process performed in the coating and developing system 1 structured as above will be explained.

Initially, before the treatment for the wafer W is started, the inert gas, for example, nitrogen gas, with its temperature and humidity being controlled, for example, at 23° C. and 45% and with very small particles being removed, is supplied into each area, that is, the transfer area 50, the heat treatment area 51, and the delivery area 52 inside the interface section 4 by each of the gas supply devices 100, 101, and 102. The atmosphere inside each area is replaced with a clean atmosphere that does not contain very small particles and impurities such as oxygen, basic substances and the like, and this state is to be maintained hereinafter.

By vacuum drawing with the pressure reducing device 110, the pressure inside the delivery area 52 is reduced to, for example, 200 to 300 Pa. In this situation, a pressure Pl inside the delivery area 52 and a pressure P2 inside the exposure processing unit 5 are set to have the relationship of P2>P1, so that the atmosphere inside the delivery area 52 is prevented from entering the exposure processing unit 5.

A pressure P0 inside a clean room in which the coating and developing system 1 is disposed is set to be lower than the pressure inside the cassette station 2, the processing station 3 and the like inside the coating and developing system 1, thereby preventing the atmosphere inside the clean room containing impurities, impurities containing very small particles and the like, very small particles, and the like from directly flowing into the coating and developing system 1 Note that the temperature humidity, or concentration of the inert gas supplied to each area may be the same as described above, or may differ as necessary.

When the processing for the wafer W is started, initially in the cassette station 2, the wafer carrier 7 takes out one unprocessed wafer W from the cassette C, and carried it to the adhesion unit 31 of the processing station 3.

Next, the wafer W coated with an adhesion reinforcer such as an HMDS for increasing adhesion to the resist solution in the adhesion unit 31, is transferred to the cooling unit 30 by the main transfer device 13 to be cooled to a predetermined temperature. Thereafter, the wafer W is transferred to the resist coating unit 17 or 19, whereby the resist coating treatment is performed. Subsequently, the wafer W with the resist film being formed is transferred to the extension unit 41 or 42 by the main transfer device 13. Thereafter, the wafer W is transferred to the transfer area 50 from the extension unit 41 or 42 by the wafer transfer mechanism 54. At this time, the third shutter 92 is temporarily opened, and when the wafer W is transferred into the transfer area 50, the third shutter 92 is closed again.

The wafer W transferred into the transfer area 50 where the atmosphere is maintained clean is transferred to the heat and cooling treatment unit 66 or 67 of the heat treatment area 51 where the atmosphere is similarly maintained clean, by the wafer transfer mechanism 54. At this time, the second shutter 87 is temporarily opened, and after the wafer W is transferred to the heat and cooling treatment unit 66 or 67, the second shutter 87 is closed again. In this situation, the inert gas, for example, nitrogen gas is supplied into the transfer area 50, the heat treatment area 51 and the delivery area 52 to keep these areas to have nitrogen gas atmosphere, whereby oxygen and water can be prevented from adhering to the resist film on the top surface of the wafer W, and suitable heat treatment can be also performed in such nitrogen gas atmosphere during heat treatment.

In the heat and cooling treatment unit 66 or 67, heat and cooling treatment is performed. In this situation, heat treatment and cooling treatment are not performed in the separate and independent units in order, but heat and cooling treatment is performed in the single unit such as the heat and cooling treatment unit 66 or 67, whereby the time taken for the wafer W to be heat-treated and cooled can be fixed, and thus the heat history given to the wafer W by heating can be made the same for each wafer W.

Thereafter, the wafer W is transferred from the heat and cooling treatment unit 66 or 67 by the wafer carrier 80, and is transferred into the delivery area 52 where the clean and pressure-reduced atmosphere is maintained. At this time, the first shutter 84 is temporarily opened, and when the wafer W is transferred into the delivery area 52, the first shutter 84 is closed again.

The wafer carrier 80 transfers the wafer W to the peripheral aligner 81. The wafer W with its peripheral portion being exposed by the peripheral aligner 81 is held by the wafer carrier 80 again, and transferred to the exposure processing unit 5 through the passage port 95. At this time, the shutter 96 is opened, and when the wafer W is transferred to the exposure processing unit 5, the shutter 96 is closed again.

From the time of the heat treatment in the heat and cooling treatment unit 66 or 67 until the time immediately before the exposure processing, the wafer W is favorably transferred in the clean atmospheres. When the delivery area 52 is in, for example, the vacuum atmosphere, it is especially in a state in which impurities hardly exist. By vacuum-drawing with the pressure reducing device 110, airflow is formed in the delivery area 52, and the airflow removes adherents adhering to the wafer W. By reducing the pressure of the atmosphere, a solvent in the resist solution can be evaporated from the wafer W.

Next, in the exposure processing unit 5, the wafer W is exposed in a predetermined circuit pattern. The wafer W after the exposure therefor is finished is transferred into the delivery area 52 through the passage port 95 by the wafer carrier 80. At this time, the shutter 96 is opened, and when the wafer W passes, the shutter 96 is closed again.

Thereafter, the wafer W passes through the first passage port 83 with the first shutter 84 being opened and is transferred to the heat and cooling treatment unit 63, 64, or 65 by the wafer carrier 80.

Heat and cooling treatment is performed in the heat and cooling treatment unit 63, 64, or 65. At this time, the heat and cooling treatment is not performed in the individual units separately provided in order, and thus the heat history given to the wafer W by heating can be made the same for each of the wafers W.

Thereafter, the wafer W passes through the second passage port 86 with the second shutter 87 being opened, and is transferred from the heat and cooling treatment unit 63, 64, or 65, and transferred into the transfer area 50, by the wafer transfer mechanism 54. Next, the wafer W passes through the third passage port 91 with the third shutter 92 being opened, and is transferred from the transfer area 50 to the extension unit 41 or 42 of the processing station 3. As described above, the wafer transfer mechanism 54 suitably transfers the wafer W from/to the processing station 3 to/from the heat treatment area 51.

From the time immediately after the exposure processing to the heat treatment in the heat and cooling treatment unit 63, 64, or 65, the wafer W is also suitably transferred in the clean atmospheres, for example, inert gas atmospheres. Further, a distance between the exposure processing unit 5 and the heat and cooling treatment unit 63, 64, or 65 is comparatively short, thus making it possible to transfer the wafer W after the exposure processing to the heat and cooling treatment unit 63, 64, or 65 in a short time.

Thereafter, the wafer W is transferred to the developing unit 18 or 20 by the main transfer device 13 and is subjected to developing treatment. The wafer W after the developing treatment is transferred to the post-baking unit 35 or 36 to be heated, and thereafter is transferred to the cooling unit 33 or 34 to be cooled to a predetermined temperature. The wafer W is transferred to the extension unit 32 of the third processing unit group G3, from which it is returned to the cassette C of the cassette station 2 by the wafer carrier 7. According to the above process steps, a series of photolithography process is completed.

According to the above embodiment, in the interface section 4, the inert gas with impurities and very small particles being removed is supplied into the transfer area 50, the heat treatment area 51, and the delivery area 52, and each area is maintained in a clean state, therefore making it possible to transfer the wafer W in the clean atmospheres and prevent impurities from adhering thereto while the wafer W goes from the heat treatment (PREBAKE) immediately before -exposure processing through the exposure processing to the heat treatment (PEB) immediately after the exposure processing.

After the wafer W with the resist film being formed is heat-treated, the wafer W is especially in a state in which impurities easily adhere onto the wafer W, and if an impurity adheres to the wafer W when it is subjected to exposure processing, the impurity absorbs energy such as laser light used for exposure, which causes a fear that the exposure processing is not suitably performed. However, if the insides of the transfer area 50, the heat treatment area 51, and the delivery area 52 are kept clean as described above, exposure processing for the wafer W can be suitably performed. The shorter the wavelength of the laser light used in the exposure processing unit 5 is, the greater the influence of the impurities becomes, and thus a profound effect is obtained when the laser light with a shorter wavelength, for example, of 157 nm, is used.

Further, impurities can be prevented from adhering to the wafer W after the exposure processing, and developing treatment can be suitably performed. Since the heat and cooling treatment units 63, 64, and 65 are disposed in the interface section 4 in particular, the wafer W can be transferred to the heat and cooling treatment units 63, 64, and 65 immediately after the exposure processing, whereby a variation in the line width of a circuit pattern can be controlled. The transferring time from the time after the exposure processing to the heat treatment (PEB), namely, PED (Post Exposure Delay) is excellently controlled, and even if a plurality of wafers W are treated, the PED for each wafer W can be made constant, and a variation in the line width of each wafer W can be reduced. Consequently, precise circuit patterns can be obtained.

The interface section 4 is divided into the transfer area 50, the heat treatment area 51 and the delivery area 52 so that the inert gas is supplied and discharged individually in each area, and thus the atmosphere inside the transfer area 50 can be made the most suitable for transferring the wafer W, the atmosphere inside the heat treatment area 51 can be made the most suitable for heating the wafer W, and the atmosphere inside the delivery area 52 can be made the most suitable for transferring the wafer immediately before and immediately after exposure processing.

Since the pressure inside the delivery area 52 is especially reduced to produce, for example, vacuum inside the delivery area 52, the wafer W can be transferred in the atmosphere in which impurities hardly exist, immediately before and immediately after exposure processing, thus making it possible to prevent impurities from adhering thereto with more reliability. Even if an impurity adheres to the wafer W, the airflow caused by vacuum drawing can remove the impurity to clean the top surface of the wafer W. In addition, the residual solvent in the resist solution can be removed.

The first partition plate 82 shuts off the transfer area 50 and the heat treatment area 51 from the delivery area 52, and only when the wafer W is transferred from/to the heat treatment area 51 to/from the delivery area 52, the first shutter 84 is opened to allow the wafer W to pass through. The second partition plate 85 shuts off the transfer area 50 from the heat treatment area 51, and only when the wafer W is transfer from/to the transfer area 50 to/from the heat treatment area 51, the second shutter 87 is opened to allow the wafer W to pass through. Consequently, the atmosphere in each area can be prevented from interfering with each other, and the transfer area 50, the heat treatment area 51, and the delivery area 52 can be maintained to have the atmospheres peculiar to the respective areas. When the inside of the delivery area 52 is under vacuum atmosphere, the vacuum atmosphere can be maintained especially by providing the partition plates 82 and 85 as described above.

Since the third partition plate 90 shuts off the processing station 3 from the interface section 4, the atmosphere in the processing station 3 can be prevented from flowing into the transfer area 50, the heat treatment area 51, and the delivery area 52 of the interface section 4, which are maintained in a clean state by the supply of the inert gas. The third shutter 92 is opened only when the wafer W is transferred from/to the processing station 3 to/from the interface section 4 to allow the wafer W to pass through. Accordingly, the atmospheres of the processing station and the interface section 4 are prevented from interfering with each other, and the atmosphere inside the transfer area 50, the heat treatment area 51, and the delivery area 52 can be maintained clean.

Further, the pressure P1 in the delivery area 52 is made lower than the pressure P2. in the exposure processing unit 5, thereby making it possible to prevent the atmosphere inside the delivery area 52 from flowing into the exposure processing unit 5 with its atmosphere being strictly controlled.

One example of the embodiment of the present invention is explained, but the present invention is not limited to this example, but various changes and modifications can be made. Not only each of the gas supply devices 100 to 102 is provided at the upper portion of the interface section 4 and each of the exhaust pipes 105 to 107 is provided at the lower portion to maintain each area in a clean state, but also gas supply devices may be provided at an upper portion of the cassette station 2 and an upper portion of the processing station 3, and exhaust pipes may be provided at the respective lower portions, thereby maintaining the insides of the cassette station 2 and the processing station 3 in a clean state. In doing so, the entire coating and developing system 1 can be maintained in a clean state, and a series of photolithography process can be suitably performed.

In order to reduce the consumption of the inert gas, it may be suitable, for example, to recover part of or entire inert gas discharged from each area, thereafter clean it, and send it to each of the gas supply devices 100 to 102 to reuse it as an inert gas.

The embodiment explained above is related to the coating and developing system for the wafer W in the photolithography process in the semiconductor wafer device fabrication processes, but the present invention is applicable in a coating and developing system for a substrate other than a semiconductor wafer, for example, an LCD substrate.

As known from the above embodiment, according to the present invention, the inert gas is supplied into the coating and developing system and thereby impurities at a molecular level such as oxygen, basic substances, ozone, organic substances and the like can be prevented from adhering to a substrate, whereby processing for the substrate can be suitably performed without being influenced by the impurities, thus making it possible to enhance yield. Since the transferring time from the time after exposure processing to heat treatment can be shortened and made fixed, a variation in line width of a circuit pattern can be controlled, and a variation in a line width of each substrate can be controlled. Consequently, a precise circuit pattern can be obtained, and, for example, a semiconductor device of high quality can be produced.

Further, the heat treatment area and the delivery area can be each maintained to have the most suitable atmosphere, and for example, the inside of the delivery area is in vacuum atmosphere, whereby impurities are more surely prevented from adhering to a substrate immediately before and immediately after exposure processing.

The substrate can be also suitably transferred from/to the processing zone to/from the heat treatment area in the clean atmosphere. The atmosphere inside the processing zone can be prevented from flowing into the interface section.

What is claimed is:

1. A coating and developing system for performing coating and developing treatment for a substrate, comprising:

a processing zone having a coating unit for forming a coating film on the substrate, a developing unit for performing development of the substrate, a heat treatment unit for performing heat treatment of the substrate, and a first transfer device for transferring the substrate from/to the coating unit, the developing unit and the heat treatment unit;

an interface section in which the substrate is transferred at least on a path between said processing zone and an exposure processing unit outside the system for performing exposure processing for the substrate;

a casing for housing said processing zone and said interface section;

a gas supply device for supplying an inert gas into said interface section; and an exhaust portion through which an atmosphere in said interface section is discharged, wherein the heat treatment unit, and a second transfer device for transferring the substrate on a path between the heat treatment unit and the exposure processing unit are disposed in said interface section.

2. A coating and developing system according to claim 1, wherein said interface section is divided into a heat treatment area in which the heat treatment unit is disposed and a delivery area in which the second transfer device is disposed, and said interface section further comprises a first air supply device for supplying the inert gas to the heat treatment area, a first exhaust portion through which an atmosphere of the heat treatment area is discharged, a second gas supply device for supplying an inert gas to the delivery area, and a second exhaust portion through which an atmosphere of the delivery area is discharged.

3. A coating and developing system according to claim 2, further comprising:

a pressure reducing device for reducing a pressure inside the delivery area.

4. A coating and developing system according to claim 2, further comprising:

a first partition plate for shutting off the atmosphere of the heat treatment area from that of the delivery area, said first partition plate having a first passage port for allowing the substrate to be transferred from/to the heat treatment area to/from the delivery area, and a first shutter for opening and closing the first passage port.

5. A coating and developing system according to claim 2, wherein a pressure inside the delivery area is lower than a pressure inside the exposure processing unit.

6. A coating and developing system according to claim 2, wherein a third transfer device for transferring the substrate on a path between said processing zone and the heat treatment area is disposed in said interface section.

7. A coating and developing system according to claim 6, further comprising:

a third gas supply device for supplying an inert gas to a transfer area in which the third transfer device is disposed, and a third exhaust portion through which an atmosphere of the transfer area is discharged.

8. A coating and developing system according to claim 6, further comprising:

a second partition plate for shutting off the atmosphere of the heat treatment area from that of the transfer area, said second partition plate having a second passage port for allowing the substrate to be transferred from/to the heat treatment area to/from the transfer area, and a second shutter for opening and closing the second passage port.

9. A coating and developing system according to claim 8, further comprising:

a third partition plate for shutting off the atmosphere of said processing zone from that of said interface section, said third partition plate having a third passage port for allowing the substrate to be transferred from/to said processing zone to/from said interface section, and a third shutter for opening and closing the third passage port.

10. A coating and developing system according to claim 1, wherein the inert gas comprises nitrogen gas.

* * * * *